(12) United States Patent
Shin et al.

(10) Patent No.: US 6,212,117 B1
(45) Date of Patent: Apr. 3, 2001

(54) DUPLICATE BITLINE SELF-TIME TECHNIQUE FOR RELIABLE MEMORY OPERATION

(75) Inventors: Jin-Uk Luke Shin, Sunnyvale, CA (US); Kenichi Osada, Kanagawa (JP); Masood Khan, San Jose, CA (US)

(73) Assignee: Hitachi Ltd., Chiyoda-Ku (JP)

( * ) Notice: Subject to any disclaimer, the term of this patent is extended or adjusted under 35 U.S.C. 154(b) by 0 days.

(21) Appl. No.: 09/588,831

(22) Filed: Jun. 7, 2000

(51) Int. Cl.$^7$ ....................................................... G11C 7/00
(52) U.S. Cl. ............................ 365/205; 365/190; 365/233
(58) Field of Search ................................... 365/233, 190, 365/154, 210, 205

(56) References Cited

U.S. PATENT DOCUMENTS

| | | | |
|---|---|---|---|
| 5,424,980 | * 6/1995 | Vinal | 365/189.01 |
| 5,432,747 | * 7/1995 | Fuller et al. | 365/203 |
| 5,719,811 | * 2/1998 | Kondou | 365/189.06 |
| 5,995,401 | * 11/1999 | Schultz et al. | 365/49 |
| 5,999,482 | * 12/1999 | Kornachuk et al. | 365/233 |

OTHER PUBLICATIONS

B.S. Amrutur, et al., "A Replica Technique for Wordline and Sense Control in Low–Power SRAM's", IEEE Journal of Solid–State Circuits, vol. 33, No. 8, Aug. 1998, pp. 1208–1219.

G. Gerosa, et al., "A 250–MHz 5–W PowerPC Microprocessor with On–Chip L2 Cache Controller," IEEE Journal of Solid–State Circuits, vol. 32, No. 11, Nov. 1997, pp. 1635–1649.

H. Shimizu, et al., "A 1.4ns Access 700MHz 288kb SRAM Macro with Expandable Architecture," 1999 IEEE International Solid–State Circuits Conference, ISSCC99 / Session 11 / Paper TA 11.1, pp. 190–191, 459.

* cited by examiner

*Primary Examiner*—Son Mai
(74) *Attorney, Agent, or Firm*—Townsend and Townsend and Crew LLP

(57) ABSTRACT

A CMOS memory array, including a number of bit cells arranged in an array of N rows and M columns includes a duplicate column of bit cells that is used for self-timing. Receipt of an address will access a predetermined number of the bit cells to generate a reset signal that is used to enable sense amplifiers for sampling bit lines of the array.

7 Claims, 3 Drawing Sheets

US 6,212,117 B1

DUPLICATE BITLINE SELF-TIME TECHNIQUE FOR RELIABLE MEMORY OPERATION

BACKGROUND OF THE INVENTION

The present invention is directed generally to semiconductor memory architectures of a type having a number of bit cells arranged in a row and column array. More particularly, the memory includes an additional column of bit cells that are used to produce a self-timed control signal that estimates the time for sampling accessed bit cells.

Semiconductor memory design today typically includes a plurality of memory cells arranged by rows and columns to form an array. Each row of memory cells connects to a word line that, when activated by the decoding of an address, accesses access the bit cells of that row. Word line activation causes the data of each bit cell of the row to be passed to a pair of bit lines of the column in which the bit cell is located. A sense amplifier is then enabled at the appropriate time to sample the voltage difference on the bit lines, and convey the sampled data to a data bus for some other output. Sampling the bit lines too early, i.e., before the differential true/complement voltages are fully developed can result in an incorrect reading of the bit lines. Sampling the bit lines later than really needed tends to slow down operation.

A number of technologies are used to implement such memory architectures. One such technology and architecture is the use of complementary MOS (CMOS) technologies to implement a static RAM (SRAM) memory architecture. Recent advances in this technology and architecture has resulted in memories that have high-speed, low power, and are easy to use (i.e., not refresh circuitry as in dynamic RAM constructions), providing significantly more storage, faster access, and lower price. However, efforts to squeeze more and faster circuitry onto a semiconductor chip has made the circuitry more vulnerable to manufacturing variations, power fluctuations, and operating environmental changes. For example, variations in the process used to produce the memory circuit, can cause the circuitry formed on one part of the semiconductor chip to have different operating characteristics from circuity on another part of that chip. This is particularly troublesome when generating the timing signals, such as the enable signal to tell the sense amplifiers when to sample their respective bit lines. Variations such as these can cause the sense amplifiers to sample bit lines too early, producing possible erroneous data.

One design approach taken to accommodate such variations has been the incorporate of self-timing circuitry to provide, for example, a signal that enables sampling of an accessed cell at the right time. Self-timing allows the generated timing to vary according to similar variations imposed upon the memory itself—whether process variations or variations resulting from operating conditions (e.g., temperature and/or power fluctuations). One such technique is the use of an inverter chain to delay an earlier signal to generate array control signals. This technique, however, has three major disadvantages. First, the delay variation can be enhanced by threshold and supply voltage variations in memory circuits designed for low voltage operation. Therefore, threshold voltage and internal supply voltage variations can cause more delay mismatches between inverter chains in the control section and memory array area Secondly, the bit cell structure often uses small sized transistors, usually a smaller size than minimum W of logic area, in an effort to obtain higher circuit density. These small W transistors are more vulnerable to process variations than typical devices in the inverter chain which magnifies delay mismatches. Lastly, inverter chain delays are dominated in both NMOS and PMOS variations while memory cell current is only a function of NMOS.

Accordingly, an approach that eliminate these disadvantages is needed.

SUMMARY OF THE INVENTION

Broadly, the present invention provides a duplicate column of bit cells, a predetermined number of which are set to a predetermined state and coupled together so that they are all accessed at the same time to produce a reset signal. The reset signal that is used as a sense enable signal to enable sense amplifiers to sample their respective bit lines at the right time. The precise control of sense amplifier activation, when enough differential voltage has developed on bit lines, is the key to the success of the reliable memory operation.

An advantage of the present invention is that the actual memory cell is used for timing the development of the differential voltage on a bit line. This ensures that memory cell current variation in the array will be closely tracked by memory cells in the duplicate column. In addition, memory cell current controls the discharge rate which is a function of total capacitance on the bit line, making it important to keep the capacitance on the bit line. Therefore, it is important to keep capacitance on the duplicate bit line as close as possible to real bitlines. The present invention provides multiple memory cells in the duplicate column with a capacitance that is substantially identical to that of regular bitlines.

These and other aspects and advantages of the present invention will become evident to those of ordinary skill in this art upon a reading of the following description of the invention, which should be taken in conjunction with the accompanying drawings.

DESCRIPTION OF THE SPECIFIC EMBODIMENTS

Figures 1, 1A:
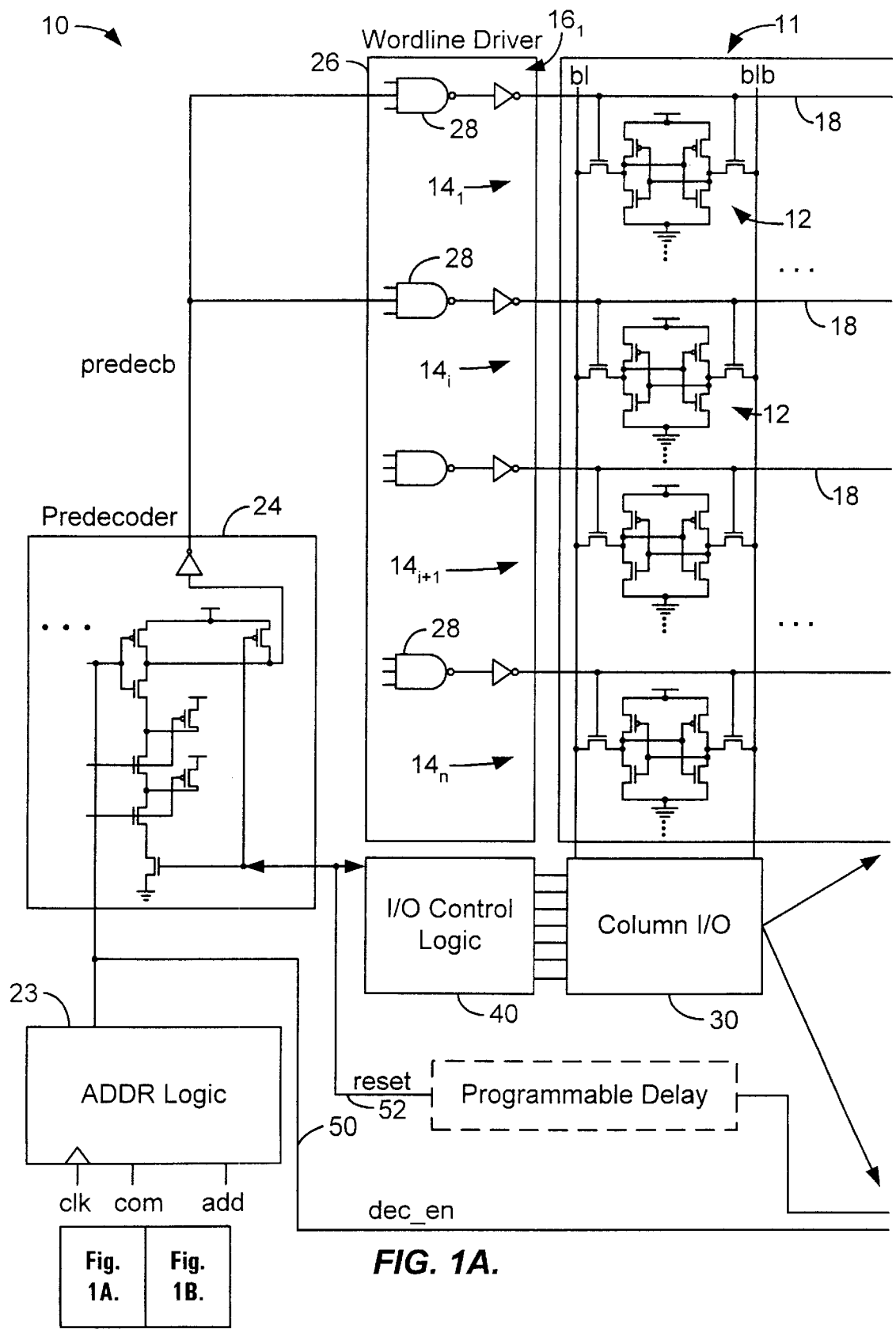
FIG. 1 is a schematic representation of a memory array, showing the duplicate column used to generated a self-timed signal according to the present invention.
Figure 1B:
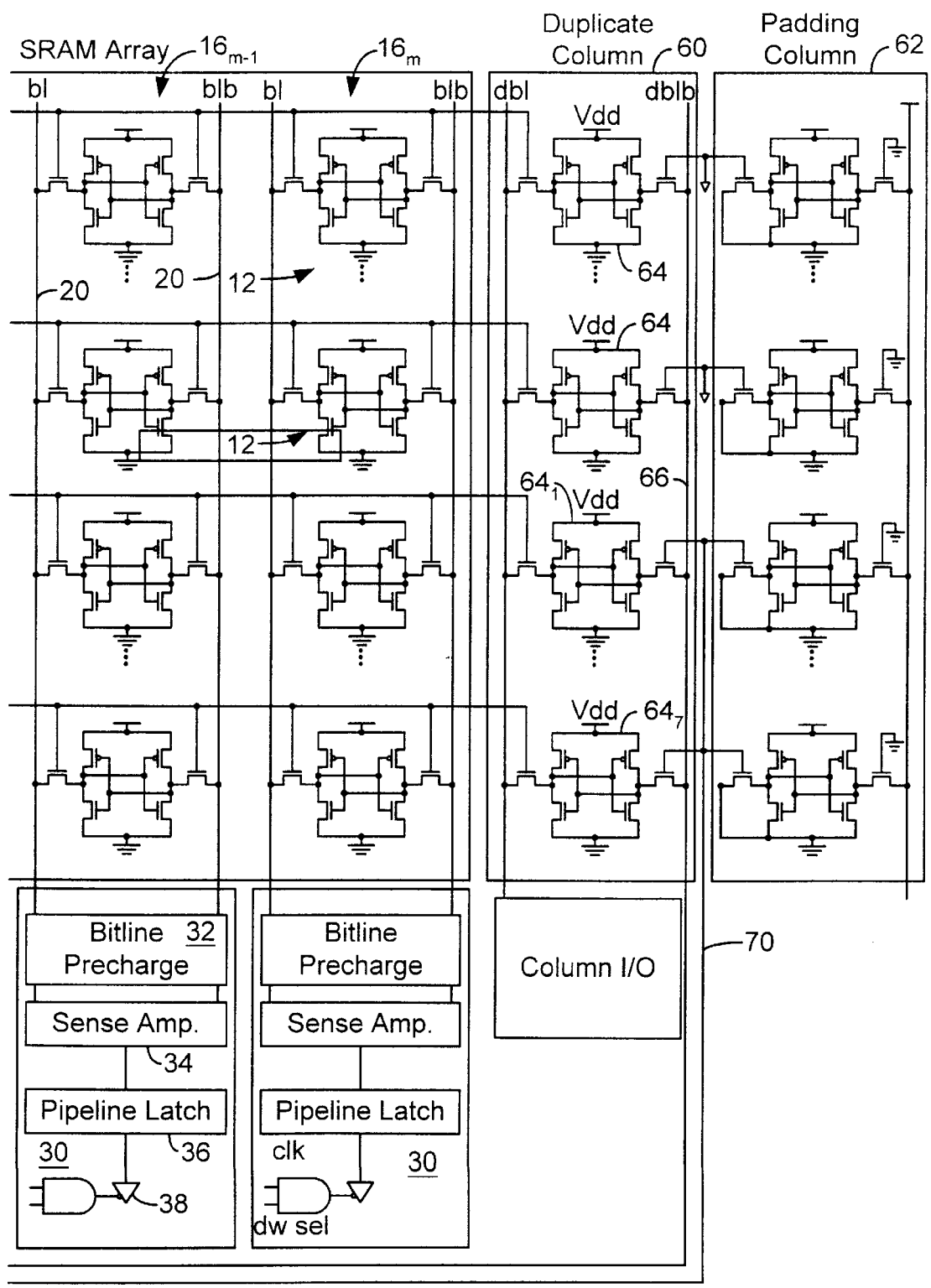

Turning now to the Figures, and for the moment FIG. 1, there is illustrated, in partial schematic form, a memory system designated generally with the reference numeral 10, including an SRAM array 11. As shown, the SRAM array 11 comprises a number of bit cells 12 arranged in N rows 14 ($14_1$, ... $14_i$, $14_{i+1}$, $14_n$) and M columns 16 ($16_1$, $16_{m-1}$, $16_m$). Word lines 18 connect to pass transistors of each bit cell 12 in a row 14, and each bit cell 12 connects to a pair of bit lines (bl/blb) 20 as is conventional. The word lines are activated initially by address logic 23, upon the receipt of a clock (CLK) signal, an address (ADD) identifying a particular column, and a memory select signal (not shown). Addresses are decoded by a two-stage decoding that includes a predecoder 24 and a final decoding performed by a word line driver 26 (as indicated by the AND gates 28 contained in the word line driver 26).

Each the bit line pairs 20 of each column connect to a column I/O logic 30 which includes, as shown for columns $16_{m-1}$ and $16_m$, a bit line precharge circuit 32, a sense amplifier 34, and a pipeline latch 36 for temporarily holding the data read from a column before applying it to a data bus (not shown) through a bus driver 38. Operation of each of the column logic 30 is controlled by signaling from I/O control logic 40 that develops, among other things, a precharge signal PCHG and a sense enable signal (SE) to first precharge the bit line pairs 20, preparing them for a read operation, and then enable the sense amplifier to sample and latch the potential difference on the bit line pairs 20.

Thus far, the description is of a conventional memory system 10, and operation of the system, except for the inclusion of the present invention, is also conventionally. Briefly, operation of the memory system is as follows. An address (and memory select signal—not shown) is applied to the address logic 23 and latched with an edge (here, the rising edge) of CLK, and a decode enable (dec_en) signal is generated on signal line 50 to initial a self-timed RESET signal—through use of the present invention as described below. At the same time, the received address is decoded by the predecoder 24 and word line driver 26 to activate one of the N word lines 18. The RESET signal on signal line 50, which is applied to the I/O control logic 40, causes generation of signaling that first precharges the bit line pairs 20 to, in essence, short them together by the bit line precharge circuit 32 and bring them to a common voltage (here, the supply voltage, Vdd). This operates to reduce swing of the equalized bit lines and thereby increase the speed of the read operation. (A similar shorting operation is preferably performed, in conventional fashion, in the sense amplifiers 34 during this early part of the read operation to increase speed.)

The word line 18, corresponding to the applied address, is activated to turn on the pass transistors of the bit cell in each row corresponding to the selected word line. The now-on pass transistors pass the state (data) held by the bit cell to the bit line pairs 20 of each column (e.g., one bit line will drop from its precharged level, while the other remains relatively unchanged), creating a potential difference on the bit line pairs 20. At the appropriate time, the sense amplifier 34 of each column 16 is turned on with a self-timed enable signal developed by the I/O control logic 20 from the RESET signal on signal line 52.

Judicious operation of the sense amplifiers 30, i.e., when to turn them on for latching data, is imperative for credible high speed, low power operation. Turning them on to soon, before the bit lines have discharged to a level that can provide credible information, can result in an erroneous reading and data. On the other hand, waiting too long before turning them on later than necessary allows the bit lines to discharge deeply, requiring a higher precharge the next cycle. This, in turn, consumes more power than necessary. However, care must be taken not to cut the timing too fine because process and other variations, described above, can affect timing and thereby the turning on of the sense amplifiers. Thus, the timing that works for one memory chip, or a portion of a memory chip, may not work for another chip or portion of the same chip. It is for this reason that worst-case design paradigms are used to ensure that the self-timed timing signals will be appropriate for all conditions, variations, and fluctuations. This, however, works against achieving high speed and low power operation.

The present invention provides a technique for providing a signal to turn on the sense amplifiers, using a self-timing technique that can vary with the variations and fluctuations that also affect the memory circuits themselves. According to the present invention, therefore, there is provided with the SRAM array 11, a duplicate bit line column 60. A padding column 62, as is sometimes used, is formed to sandwich the duplicate column 60 between the SRAM array 11 and the padding column itself. (A padding column, such as padding column 62, is often used at the periphery of the memory array. It is not operational; its function is to ensure that the edge column, column $16_m$ in conventional memory designs, or duplicate column 60 here, is not subjected to the deviations often found at the peripheries of such formations.)

Preferably, the duplicate bit line column 60 mimics the columns 16 in order that the bit cells of the column have a capacitance substantially the same as that of the bit cells 12 of the other columns 16. Thus, the placement of the duplicate column is preferably parallel and next to the other memory columns 16 as shown in FIG. 1.

The duplicate column 60 includes N bit cells 64 formed to be "hard-wired" to a predetermined state. The hard-wiring is achieved by tying the gates leads of one or the other of the two CMOS inverters to the supply voltage, Vdd. Here, as FIG. 1 shows, the gate leads of the PMOS and NMOS transistors forming the right CMOS inverter is connected to the supply voltage. The bit line 66 on that side is connected to the signal line 52, and as will be seen, it is the access of a selected number of bit cells 64 that develops the RESET signal.

The bit line 70 that would normally be for the padding column 62 is not connected to the padding column, but is used as a word line for the duplicate column 60. Thus, the gate of pass transistors of a selected number of the bit cells 64 are connected to the "word line" 70. The pass transistors of the non-selected bit cells have their gates connected to ground. The word line 70 connects to the signal line 50 to receive the dec_en signal supplied by the address logic 23. As indicated, not all the bit cells 64 of the duplicate column 60 are connected to the word line 70. Only that number of bit cells necessary for developing the RESET signal with a timing that enables the sense amplifiers to sample at the appropriate time is used. For example, in an array having 256 rows and 256 columns, i.e., and 8K memory, only 7 of the bit cells 64 are needed. Accordingly, only the seven (of 256) bit cells $64_1, \ldots, 64_7$ are connected to the word line 70.

Figure 2:
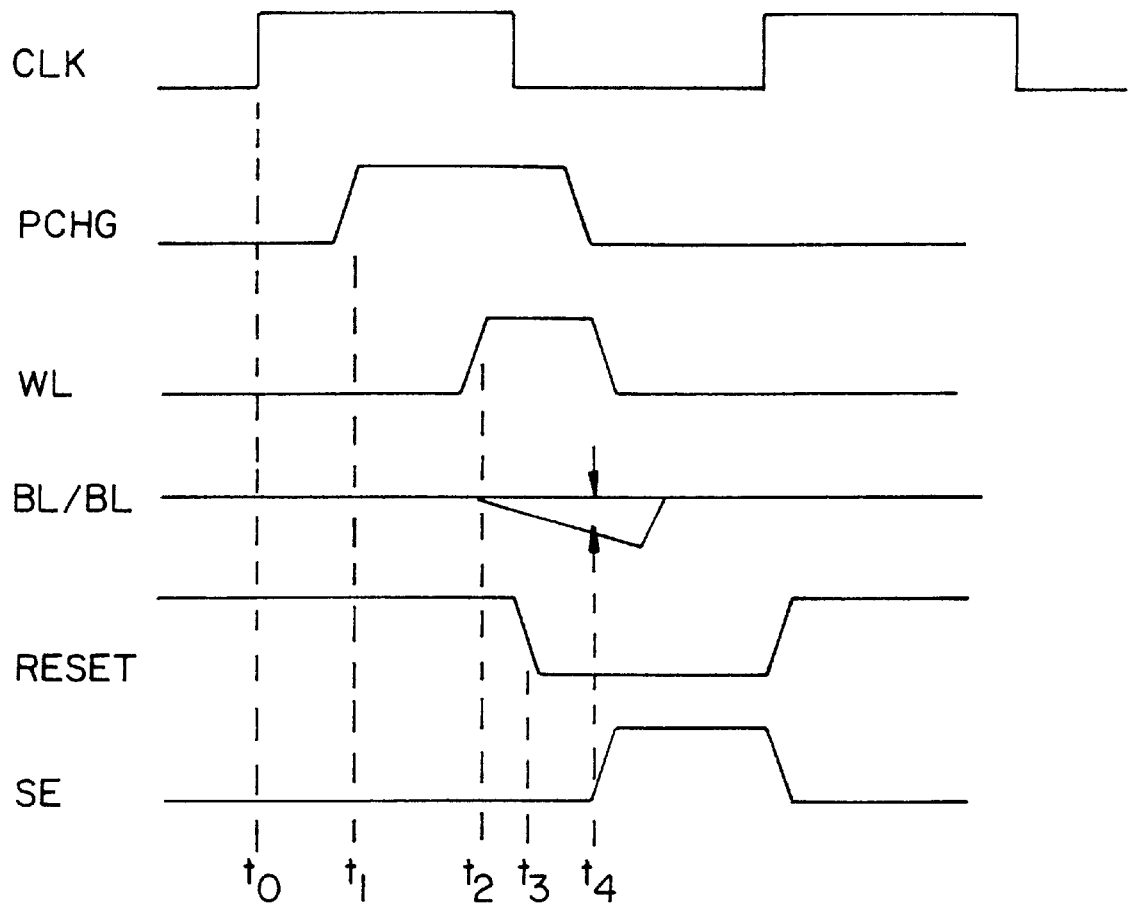
FIG. 2 is a timing diagram illustrating operation of the present invention as implemented in FIG. 1.

Referring to FIG. 2, a read cycle is shown. Starting at time $t_0$, the rise of system clock (CLK), the dec_en signal is asserted and coupled to the word line 70 used for the duplicate column 60. Since the right side transistors of the bit cells of the duplicate column 60 have the gates tied to the supply voltage Vdd, holding a $\overline{data}$ state, bit cells $64_1, \ldots, 64_7$ will begin to discharge the corresponding bit line 66, developing the negative-going RESET signal that is conveyed to the signal line 52. The precharge signal (PCHG), which previously was applied to the bit lines (bl/$\overline{bl}$) to precharge them to a predetermined potential, e.g., the supply voltage Vdd, is turned off at time $t_{10}$. A short time later, the applied address will be decoded, causing the word line corresponding to the address to have applied thereto a word line signal (WL) at time $t_2$. This will cause one of the bit lines bl/$\overline{bl}$ corresponding to the $\overline{data}$ of the bit cell to discharge the corresponding bit line; the other bit line will remain high. Then, at time $t_3$, the RESET signal will be formed from the bit cells $64_1, \ldots 64_7$ of the duplicate column 60. The RESET signal will be passed through the I/O control logic 40 to produce the sense enable (SE) signal at time $t_4$ to enable the sense amplifiers 34 of each of the columns 16 to sample the potential differences on their corresponding bit lines bl/$\overline{bl}$. The RESET signal also operates to reset the word line and precharge signals WL and PCHG, readying them for the next cycle.

As indicated above, the number of bit cells 64 selected to be connected to the bit line 66 of the duplicate column 60 is based upon the time it takes to develop a sufficient potential difference on the bit lines of the columns 16 for correct sensing by the sense amplifiers 34. As also indicated above, this was empirically determined to be seven bit cells for a 256 by 256 memory array. Other numbers of bit cells may need to be determined for other designs of memory arrays.

In an alternate embodiment of the invention, the memory system 10 may be provided a programmable delay 80 to "fine tune" the development of the RESET signal.

The preceding has been a description of the preferred embodiment of the invention. It will be appreciated that deviations and modifications can be made without departing from the scope of the invention, which is defined by the appended claims. For example, the dec_en signal carried on line 50 to initiate the generation of the RESET signal by the duplicate column 60 is described as being the product of the address signals and a memory select signal (not shown). This need not be the case. As is conventional, a dec_en signal can be developed from the address signals alone.

What is claimed is:

1. A CMOS static random access memory (ram) of the type having a plurality of bit cells arranged in a number of rows and columns forming an array, each of the bit cells storing a bit of data in true and complement form, each of the number of columns of bit cell being connected to a sense amplifier by a pair of bit lines, further comprising:

number of sense amplifiers each respectively coupled to receive the bit lines of a corresponding one of the number of columns, each sense amplifier having an enable input for receiving an enable signal to enable sensing voltage on the bit lines;

a duplicate column containing a predetermined number of bit cells coupled to a pair of duplicate bit lines, the number of bit cells being set to a predetermined state;

a decoder coupled to receive an address and to the predetermined number of bit cells, the decoder operating to generate a decode enable signal to access the predetermined number of bit cells to issue therefrom a sense enable signal; and each of the sense amplifiers of each of the number of columns coupled to receive the enable signal to sample the corresponding bit lines connected thereto.

2. A memory circuit, including:

an array of bit cells arranged in N rows and M columns coupled to N word lines and M bit line pairs;

M sense amplifiers coupled to corresponding ones of the M bit lines, each of the M sense amplifiers having a sense input for receiving an enable signal;

a duplicate column containing a number of duplicate bit cells; and a control circuit coupled to receive address signals for generating therefrom a decode enable signal that is coupled to a duplicate bit line to access the number of duplicate bit cells, generating therefrom the enable signal.

3. The memory circuit of claim 2, including precharge circuits coupled to the bit cells for applying a predetermined charge to the bit lines.

4. The memory circuit of claim 3, wherein the enable signal is used to terminate the application of the predetermined charge.

5. The memory circuit of claim 2, wherein the array of bit cells is formed on a semiconductor chip, and the duplicate column is formed next to the array of bit cells and oriented parallel to the M columns.

6. The memory circuit of claim 2, including a pad column of bit cells coupled to the duplicate column of bit cells, the pad column including a pair of bit lines coupled to each of the pad column of bit cells.

7. A method of generating a sense enable signal for application to sense amplifiers of a memory array of a type having N rows and M columns of bit cells, the method including the steps of providing a duplicate column of R bit cells, where R is an integer less than or equal to M;

coupling the outputs of the a number of the R bit cells together;

using a produced signal to access the number of the R bit cells to generate an enable signal for application to the sense amplifiers.

* * * * *